US011817520B2

(12) United States Patent
Shibasaki et al.

(10) Patent No.: US 11,817,520 B2
(45) Date of Patent: Nov. 14, 2023

(54) METHOD FOR MANUFACTURING STACKED THIN FILM, METHOD FOR MANUFACTURING SOLAR CELL, AND METHOD FOR MANUFACTURING SOLAR CELL MODULE

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Soichiro Shibasaki, Nerima (JP); Yuya Honishi, Saitama (JP); Mutsuki Yamazaki, Yokohama (JP); Naoyuki Nakagawa, Setagaya (JP); Sara Yoshio, Yokohama (JP); Yoshiko Hiraoka, Kawasaki (JP); Kazushige Yamamoto, Yokohama (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 543 days.

(21) Appl. No.: 17/015,490

(22) Filed: Sep. 9, 2020

(65) Prior Publication Data

US 2021/0013360 A1 Jan. 14, 2021

Related U.S. Application Data

(63) Continuation of application No. PCT/JP2020/008386, filed on Feb. 28, 2020.

(30) Foreign Application Priority Data

Feb. 28, 2019 (JP) .................. 2019-036209
Jun. 14, 2019 (JP) .................. 2019-111030
Feb. 28, 2020 (JP) .................. 2020-033237

(51) Int. Cl.
*H01L 31/18* (2006.01)
*H01L 31/046* (2014.01)
*H01L 31/076* (2012.01)

(52) U.S. Cl.
CPC ............ *H01L 31/18* (2013.01); *H01L 31/046* (2014.12); *H01L 31/076* (2013.01)

(58) Field of Classification Search
None
See application file for complete search history.

(56) References Cited

U.S. PATENT DOCUMENTS

2012/0152337 A1 6/2012 Aytug et al.
2017/0009334 A1* 1/2017 Ciraldo ............... C03C 17/3417
(Continued)

FOREIGN PATENT DOCUMENTS

CN 101058484 A 10/2007
JP 2003-282897 A 10/2003
(Continued)

OTHER PUBLICATIONS

International Search Report dated Apr. 7, 2020 in PCT/JP2020/008386 filed Feb. 28, 2020, 3 pages.
(Continued)

*Primary Examiner* — Evren Seven
(74) *Attorney, Agent, or Firm* — Oblon, McClelland, Maier & Neustadt, L.L.P.

(57) ABSTRACT

A method for manufacturing a stacked thin film, includes forming a photoelectric conversion layer on a first transparent electrode by sputtering using a target mainly composed of copper in an oxygen containing atmosphere. An oxygen partial pressure of the sputtering is in a range of 0.01 [Pa] or more and 4.8 [Pa] or less, and 0.24×d [Pa] or more and 2.4×d [Pa] or less when a deposition rate is d [μm/min], in formation of the photoelectric conversion layer. A sputtering
(Continued)

temperature is 300° C. or more and 600° C. or less, in formation of the photoelectric conversion layer.

8 Claims, 9 Drawing Sheets

(56) References Cited

U.S. PATENT DOCUMENTS

| | | |
|---|---|---|
| 2020/0091357 A1 | 3/2020 | Shibasaki et al. |
| 2020/0091365 A1 | 3/2020 | Shibasaki et al. |
| 2020/0194608 A1 | 6/2020 | Yamamoto et al. |

FOREIGN PATENT DOCUMENTS

| | | |
|---|---|---|
| JP | 2006-9083 A | 1/2006 |
| JP | 2006-124754 A | 5/2006 |
| JP | 2020/53668 A | 4/2020 |
| JP | 2020/53669 A | 4/2020 |
| WO | WO 2020/059053 A1 | 3/2020 |

OTHER PUBLICATIONS

Minami, T. et al., "Efficiency enhancement using a $Zn_{1-x}Ge_x$—O thin film as an n-type window layer in $Cu_2O$-based heterojunction solar cells," Applied Physics Express, vol. 9, No. 052301, http://doi.org/10.7567/APEX.9.52301, 2016, 5 pages.

Narushima, T. et al., "High temperature oxidation event of gelatin nanoskin-coated copper fine particles observed by in situ TEM," AIP Advances, vol. 2, No. 042113, 2012, 10 pages.

Li, J. et al., "Oxidation and reduction of copper oxide thin films," Journal of Applied Physics, vol. 69, No. 1020, Jan. 15, 1991, 11 pages.

Ishizuka, S. et al., "Thin-Film, Deposition of $Cu_2O$ by Reactive Radio-Frequency Magnetron Sputtering," Japan Journal of Applied Physics, vol. 39, Part 2, No. 8A, Aug. 1, 2000, 4 pages.

Reddy, A. S. et al., "Properties of dc magnetron sputtered $Cu_2O$ films prepared at different sputtering pressures," Applied Surface Science, vol. 253, 2006, 6 pages.

Gan, J. et al., "Influence of target power on properties of $Cu_xO$ thin films prepared by reactive radio frequency magnetron sputtering," Thin Solid Films, vol. 594, May 28, 2015, 7 pages.

\* cited by examiner

METHOD FOR MANUFACTURING STACKED THIN FILM, METHOD FOR MANUFACTURING SOLAR CELL, AND METHOD FOR MANUFACTURING SOLAR CELL MODULE

CROSS-REFERENCE TO RELATED APPLICATION

This application is a continuation application based upon and claims the benefit of priority from Japanese Patent Applications No. 2019-036209, filed on Feb. 28, 2019, No. 2019-111030 filed on Jun. 14, 2019, and No. 2020-033237 filed on Feb. 28, 2020; and International Application PCT/JP2020/008386, the International Filling Date of which is Feb. 28, 2020 the entire contents of which are incorporated herein by reference.

FIELD

Embodiments described herein relate generally to a method for manufacturing a stacked thin film, a method for manufacturing a solar cell, and a method for manufacturing a solar cell module.

BACKGROUND

Multi-junction (tandem) solar cells are known as high-efficiency solar cells. Tandem solar cells are more efficient than unijunction solar cells because tandem solar cells include cells having higher spectral sensitivity for each wavelength range. One of prospective materials for the top cells of tandem solar cells is a cuprous oxide compound, which is inexpensive and has a wide band gap. Some conventional cuprous oxide solar cells made of oxidized copper foils have been reported to achieve an efficiency of approximately 8%; however, this efficiency is lower than the theoretical efficiency limit. This is considered to be poor pn junctions caused by heterogeneous substances such as copper oxide that have not been removed sufficiently by etching from the uppermost surfaces after the oxidization of copper foils, or residual elements of etching solution. Moreover, in the conventional methods, it is necessary that an oxidized foil having a thickness of approximately 0.1 mm be polished to have a thickness of approximately 20 µm, and it is difficult to increase area of solar cell.

There is another method in which a thin film is manufactured through reaction in a liquid phase; however, the efficiency is approximately 4% at the highest. The main cause is that the impurities in the solution as well as heterogeneous substances are absorbed into the film and become the centers of the recombination of photoexcitation carriers. Such a thin film absorbs light at a wavelength equal to or more than 600 nm, which is not to be absorbed originally. Therefore, this thin film cannot be used for the top cell of a tandem solar cell. Sputtering is generally known as a method for manufacturing a thin film containing fewer impurities. Thin films manufactured in this method, however, have been reported to have a conversion efficiency equal to or less than 1%. This is because even if no impurity contamination occurs, heterogeneous substances such as copper and cupric oxide are easily generated, which makes it difficult to manufacture high-quality cuprous oxide layers.

DETAILED DESCRIPTION

A method for manufacturing a stacked thin film, includes forming a photoelectric conversion layer on a first transparent electrode by sputtering using a target mainly composed of copper in an oxygen containing atmosphere. An oxygen partial pressure of the sputtering is in a range of 0.01 [Pa] or more and 4.8 [Pa] or less, and 0.24×d [Pa] or more and 2.4×d [Pa] or less when a deposition rate is d [µm/min], in formation of the photoelectric conversion layer. A sputtering temperature is 300° C. or more and 600° C. or less, in formation of the photoelectric conversion layer.

First Embodiment

Figure 1:
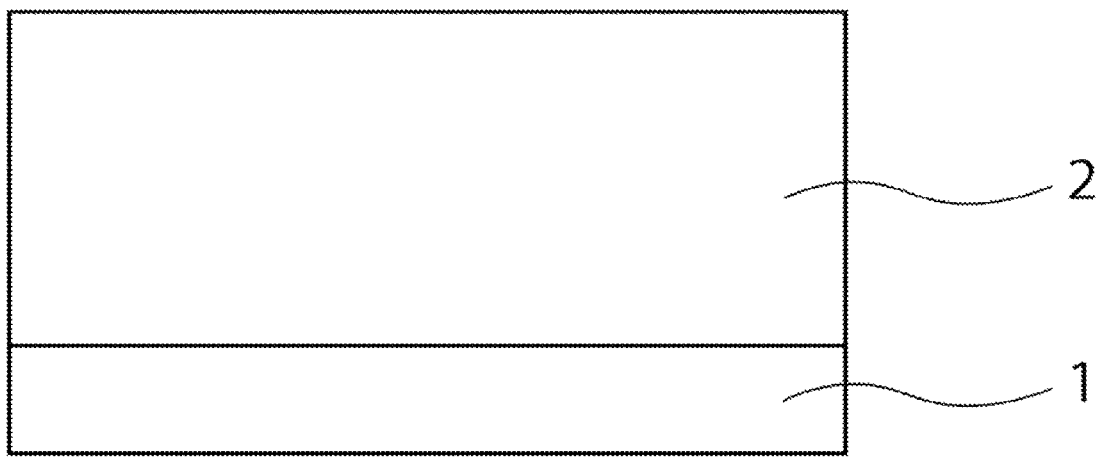
FIG. 1 is a schematic cross-sectional view of a stacked thin film according to an embodiment.

A first embodiment relates to a stacked thin film and a method for manufacturing a stacked thin film. FIG. 1 is a schematic cross-sectional view of a stacked thin film 100. A stacked thin film 100 of FIG. 1 includes a first transparent electrode 1 and a photoelectric conversion layer 2 formed on the first transparent electrode 1.

The first transparent electrode 1 constitutes a stacked structure together with the photoelectric conversion layer 2. In FIG. 1, the first transparent electrode 1 is in direct contact with the photoelectric conversion layer 2. The main surface of the first transparent electrode 1 faces the main surface of the photoelectric conversion layer 2, and these two main surfaces share an interface. It is preferable that the entire surface of the photoelectric conversion layer 2, which faces the first transparent electrode 1, be in direct contact with the first transparent electrode 1. The first transparent electrode 1 is a p-type electrode in direct contact with the photoelectric conversion layer 2, which is also p-type. It is preferable that the first transparent electrode 1 have a thickness of 100 nm or more and 1000 nm or less, for example.

It is preferable that the first transparent electrode 1 include a transparent electrically-conductive oxide film. Materials for the transparent electrically-conductive oxide film include, but not limited to, indium tin oxide (ITO), Al-doped zinc oxide (AZO), boron-doped zinc oxide (BZO), gallium-doped zinc oxide (GZO), fluorine-doped tin oxide (FTO), antimony-doped tin oxide (ATO), titanium-doped indium oxide (ITiO), indium zinc oxide (IZO), indium gallium zinc oxide (IGZO), Ta-doped tin oxide ($SnO_2$:Ta), Nb-doped tin oxide ($SnO_2$:Nb), W-doped tin oxide ($SnO_2$:W), Mo-doped tin oxide ($SnO_2$:Mo), and hydrogen-doped indium oxide (IOH). Such a transparent electrically-conductive oxide film may be a stacked film including a plurality of films and include a tin oxide film other than the above oxides. Dopants for films such as the tin oxide film include, but not limited to, one or more substances selected from the group including In, Si, Ge, Ti, Cu, Sb, Nb, F, Ta, W, Mo, Br, I, and Cl. It is preferable that the photoelectric conversion layer 2 be in direct contact with the transparent electrically-conductive oxide film included in the first transparent electrode 1.

It is preferable that the first transparent electrode 1 have a stacked structure in which an indium tin oxide film and a doped tin oxide film are stacked on each other. Specifically, it is preferable that the first transparent electrode 1 have one or more stacked structures selected from the group including a stacked film of an indium tin oxide film and an antimony-doped tin oxide film, a stacked film of an indium tin oxide film and a fluorine-doped tin oxide film, a stacked film of an indium tin oxide film and a Ta-doped tin oxide film, and a stacked film of an indium tin oxide film and a Nb-doped tin oxide film. When the first transparent electrode 1 includes a doped tin oxide film, it is preferable that the doped tin oxide film be in direct contact with the photoelectric conversion layer 2.

The first transparent electrode 1 may include a metal film having a thickness equal to or less than 10 nm. The metal film includes, but not limited to, one or more films selected from the group including Mo, Au, Cu, Ag, Al, Ta, Pt, Ru, and W. The first transparent electrode 1 may be an electrode including metal in a dot form, a line form, or a mesh form on the top or bottom of the transparent electrically-conductive oxide film. In this case, the metal in a dot form, a line form, or a mesh form is disposed between the transparent electrically-conductive oxide film and the photoelectric conversion layer 2. It is preferable that the metal in a dot form, a line form, or a mesh form have an aperture ratio equal to or more than 50% with respect to the transparent electrically-conductive oxide film. The metal in a dot form, a line form, or a mesh form includes, but not limited to, Mo, Au, Cu, Ag, Al, Ta, Pt, Ru, and W. Because providing the metal in a dot form, a line form, or a mesh form ensures transparency, the metal film may have any thickness.

In view of improving the crystallinity of the photoelectric conversion layer 2, it is preferable that the surface of the first transparent electrode 1 on which the photoelectric conversion layer 2 will be formed be a thin film of a metallic oxide mainly composed of Sn (a transparent electrically-conductive oxide film). It is preferable that Sn account for 90 atom % or more in the metal of the metallic oxide mainly composed of Sn. The metallic oxide thin film mainly composed of Sn may contain one or more metals (metallic oxides) selected from the group consisting of Zn, Al, Ga, In, Si, Ge, Ti, Cu, Sb, Nb, F, and Ta other than Sn. If the photoelectric conversion layer 2 is formed directly on a metallic oxide mainly composed of In (e.g. ITO), the stacked boy of the ITO film and the substrate is easily deformed due to a high temperature. Therefore, an ITO film is not suitable for the direct formation of a $Cu_2O$ film thereon.

The photoelectric conversion layer 2 is a p-type compound semiconductor layer mainly composed of cuprous oxide. Cuprous oxide is represented by $Cu_2O$ and is an oxide semiconductor. Cuprous oxide is non-doped or doped cuprous oxide. The photoelectric conversion layer 2 has a thickness of 500 nm or more and 10 µm or less, for example. The thickness of the photoelectric conversion layer 2 is preferably 1000 nm or more and 5 µm or less, and more preferably 1500 nm or more and 3 µm or less. The thickness of the photoelectric conversion layer 2 can be determined through cross-section observation, for example.

It is preferable that the photoelectric conversion layer 2 have many large cuprous oxide crystals and contribute to excellent conversion efficiency and light transparency of a solar cell including the stacked thin film 100. The stacked thin film 100 manufactured by the method according to an embodiment of the present disclosure will have large cuprous oxide crystals and contribute to the improved conversion efficiency and light transparency. It is preferable that the photoelectric conversion layer 2 contain cuprous oxide at 95 wt % or more. It is preferable that the photoelectric conversion layer 2 contain cuprous oxide at 98 wt % or more. In other words, it is preferable that the photoelectric conversion layer 2 contain almost no (substantially little) heterogeneous substances such as CuO and Cu. The photoelectric conversion layer 2 containing almost no heterogeneous substances such as CuO and Cu and being a substantially homogeneous $Cu_2O$ thin film has very high light transparency, which is preferable. A photo luminescence (PL) method can be used for determining whether the photoelectric conversion layer 2 is a substantially homogeneous $Cu_2O$ thin film or not.

It is preferable that the photoelectric conversion layer 2 contain Cu of 60.0 atom % or more and 67.0 atom % or less and O (oxygen) of 32.5 atom % or more and 34.0 atom % or less. The photoelectric conversion layer 2 may contain an element selected from the group including metals other than Cu, dopants, and impurities, except Cu and O (oxygen). The photoelectric conversion layer 2 may contain a metal other than Cu as an oxide and be a complex oxide. The metals contained in the photoelectric conversion layer 2 include one or more metals selected from the group including Sn, Sb, Ag, Li, Na, K, Cs, Rb, Al, Ga, In, Zn, Mg, and Ca, in addition to Cu. When the photoelectric conversion layer 2 contains one or more metals selected from the group including Ag, Li, Na, K, Cs, Rb, Al, Ga, In, Zn, Mg, Ta, and Ca, in addition to Cu; the band gap of the photoelectric conversion layer 2 can be adjusted. The photoelectric conversion layer 2 may have a p+ region containing one or more p-type dopants selected from Si, Ge, and N at a high content on the side adjacent to the first transparent electrode 1.

It is preferable that the band gap of the photoelectric conversion layer 2 be 2.0 eV or more and 2.2 eV or less. In a multi-junction solar cell including a solar cell having a light absorbing layer of Si as the bottom cell and a solar cell having a thin film of this embodiment as the top cell, the band gap in this range will enable both the top cell and the bottom cell to efficiently use solar energy. The composition of the photoelectric conversion layer 2 can be represented by $Cu_aM_bO_c$. M represents one or more elements selected from the group including Si, Ge, N, Sn, Sb, Ag, Li, Na, K, Cs, Rb, Al, Ga, In, Zn, Mg, Ta, and Ca. It is preferable that the ranges of a, b, and c be $1.80 \leq a \leq 2.01$, $0.00 \leq b \leq 0.20$, and $0.98 \leq c \leq 1.02$, respectively. The above composition ratio of the photoelectric conversion layer 2 is the composition ratio of the entire photoelectric conversion layer 2. In addition, it is preferable that the above compound composition ratio of the photoelectric conversion layer 2 be met in the entire photoelectric conversion layer 2. The photoelectric conversion layer 2 may contain additive(s) other than the above substances.

Figure 2:
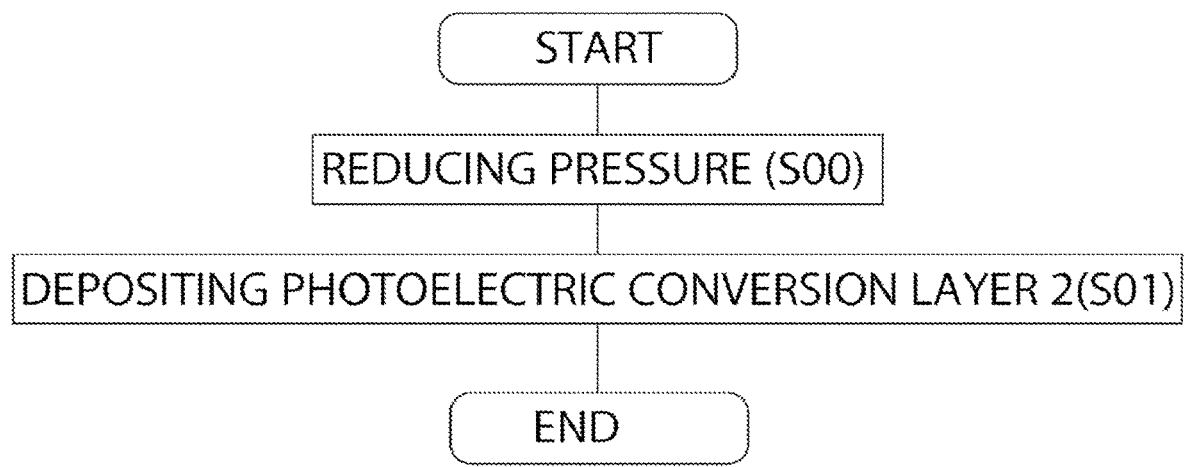
FIG. 2 is a flowchart showing a method for manufacturing a stacked thin film according to an embodiment.

A method for manufacturing the stacked thin film 100 will now be described. FIG. 2 is a flowchart showing the method for manufacturing the stacked thin film 100. The method for manufacturing the stacked thin film 100 includes a step (S01) for forming the photoelectric conversion layer 2 on the first transparent electrode 1 by sputtering using a target mainly composed of copper in an atmosphere at an oxygen partial pressure of 0.01 [Pa] or more and 10 [Pa] or less. Before the step (S01) for formation of the photoelectric conversion layer 2, the method may optionally include a step (S00) for pressure reduction.

The target mainly composed of copper has a copper purity equal to or more than 99.99%. The copper purity is preferably equal to or more than 99.995%, more preferably equal to or more than 99.999%. The target having a high cupper purity provides the substantially homogeneous $Cu_2O$ photoelectric conversion layer 2. When the target contains the element(s) to be contained in the photoelectric conversion layer 2 (e.g. Si), the cupper purity may be different.

The sputtering atmosphere is preferably an oxidizing atmosphere in which inert gas and oxygen gas are mixed. The sputtering atmosphere is more preferably an atmosphere of inert gas and oxygen gas. The inert gas is preferably nitrogen gas, argon gas, or mixed gas of nitrogen gas and argon gas.

Figure 3:
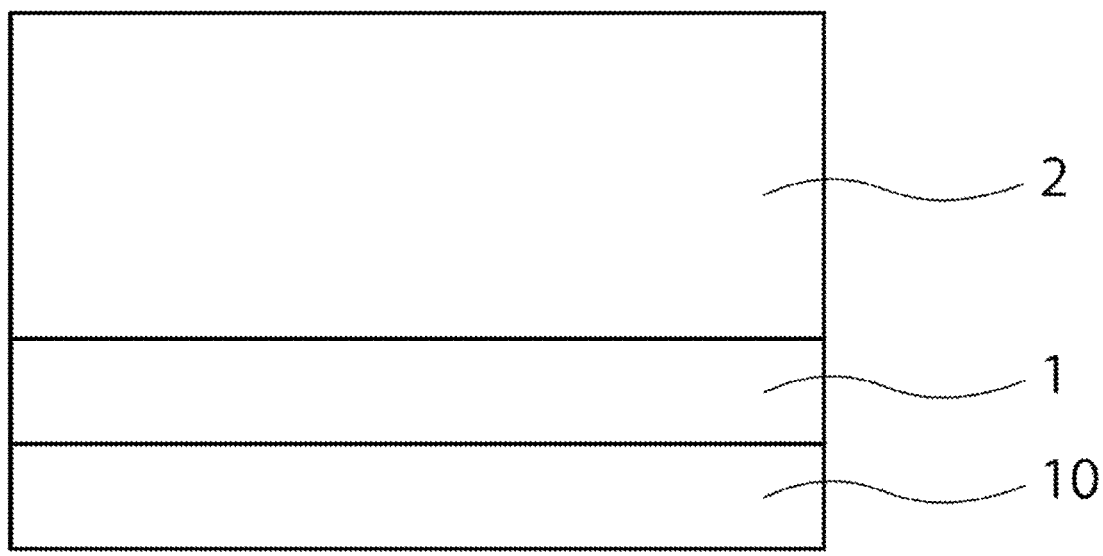
FIG. 3 is a schematic cross-sectional view of a stacked thin film according to an embodiment.

Sputtering is performed on a base substrate in which the first transparent electrode 1 is formed on a substrate 10 such as a glass substrate, for example. FIG. 3 is a schematic cross-sectional view of a stacked thin film 101 including the substrate 10. Sputtering is performed on the first transparent electrode 1 so that the photoelectric conversion layer 2 is deposited on the first transparent electrode 1. Before performing sputtering, it is preferable that the step (S00) be taken for reducing the pressure in the chamber where the first transparent electrode 1 is disposed to $5.0 \times 10^{-3}$ [Pa] or less. The step (S00) for pressure reduction may be taken in a chamber for sputtering or a subchamber for sputtering. In the step for pressure reduction, different from the step for sputtering, oxygen is not introduced. The substrate 10 can be used for a substrate for a solar cell including the thin film 101. The first transparent electrode 1 is formed on the substrate 10 by e.g. sputtering. It is preferable that the substrate 10 be made of glass such as white sheet glass, soda-lime glass, chemically strengthened glass, and quartz glass. The substrate 10 may be made of an organic material such as acryl, polycarbonate, and polyimide.

The total pressure in the chamber during sputtering is typically 0.1 [Pa] or more and 10 [Pa] or less. Sputtering is performed in an atmosphere at an oxygen partial pressure of 0.01 [Pa] or more and 10 [Pa] or less (the first condition). Sputtering in this oxygen partial pressure range enables the deposition of substantially homogeneous cuprous oxide on the first transparent electrode 1. When the oxygen partial pressure is too high, copper is oxidized too much and CuO is generated in addition to cuprous oxide. When the oxygen partial pressure is too low, copper is not oxidized sufficiently and part of the Cu is deposited in the form of metal. Heterogeneous substances such as CuO and Cu deposited on the first transparent electrode 1 will reduce the conversion efficiency of a solar cell including the stacked thin film 100 as well as the light transparency of the stacked thin film 100, which results in unsuitability for the top cell of a solar cell. Sputtering may be DC sputtering, RF sputtering, DC magnetron sputtering, RF magnetron sputtering, or ion beam sputtering.

Figure 4:
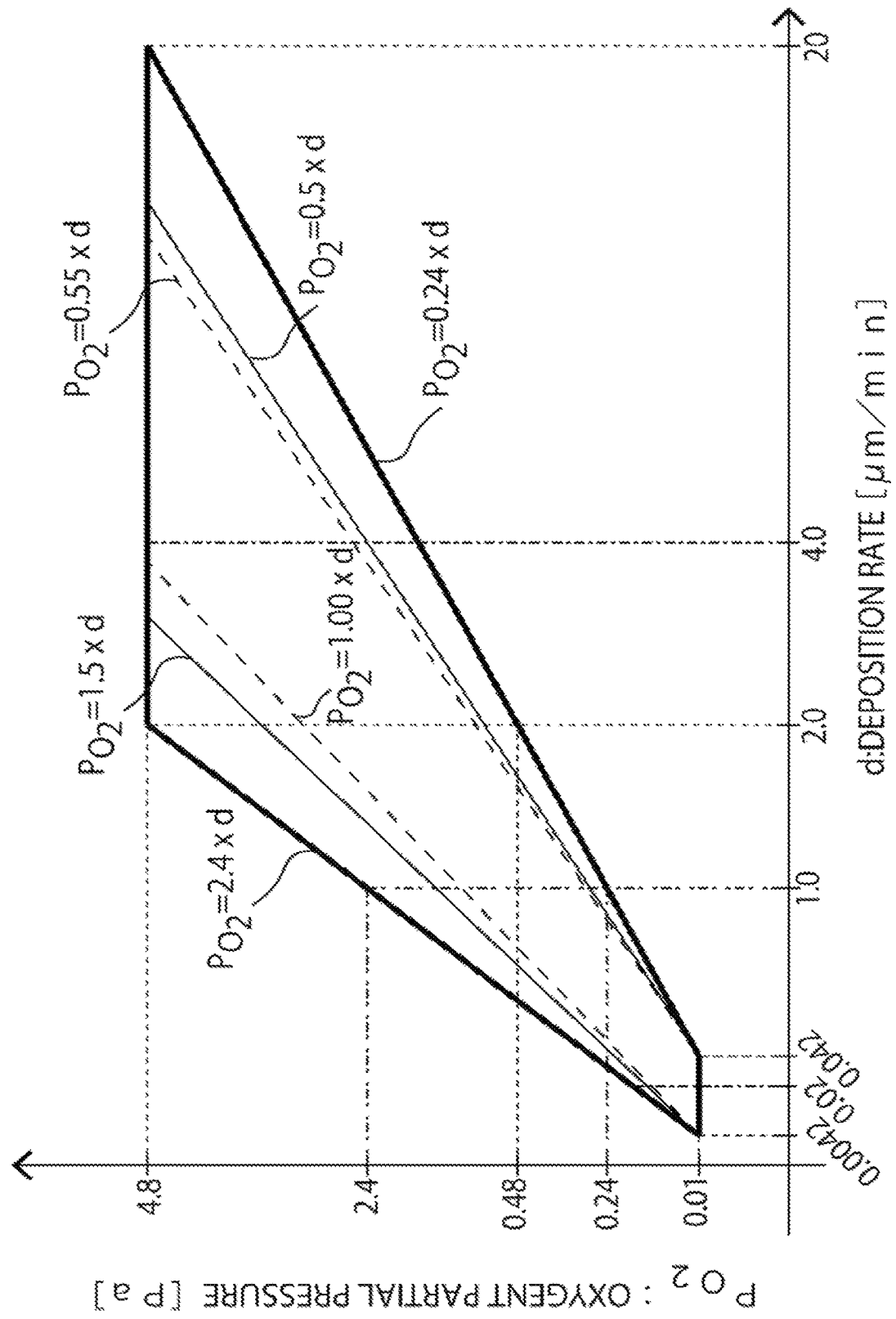
FIG. 4 is a graph showing a relationship between an oxygen partial pressure and a deposition rate in an embodiment.

When the oxygen partial pressure is in the range of 0.01 [Pa] or more and 4.8 [Pa] or less (the second condition) and the deposition rate is represented by d [μm/min] in the formation of the photoelectric conversion layer 2, it is preferable, in view of the deposition of high-quality cuprous oxide, that the oxygen partial pressure is 0.5×d [Pa] or more and 1.5×d [Pa] or less (the third condition). The deposition rate can be determined based on the time during which sputtering is actually being performed. When sputtering is performed intermittently, the deposition rate is determined based on the time excluding the time during which sputtering is not being performed (film formation is not being performed). FIG. 4 is a graph showing a relationship between an oxygen partial pressure and a deposition rate in an embodiment of the present disclosure. The area enclosed by the thin lines in FIG. 4 is the range that meets the second and third conditions. It should be noted that the bold lines, the thin lines, and the broke lines overlap with each other at the oxygen partial pressures of 0.01 Pa and 4.8 Pa. The photoelectric conversion layer 2 having transparency can be formed within the area inside the bold lines. The photoelectric conversion layer 2 formed within the area inside the bold lines and inside the thin lines, however, has excellent crystallinity and very high transparency compared with the photoelectric conversion layer 2 formed within the area inside the bold lines but outside the thin lines. Since too low deposition rate is not practical, it is preferable that the deposition rate be equal to or more than 0.02 μm/min (the fourth condition). The deposition rate is preferably equal to or less than 20 μm/min (the fifth condition). Because a high deposition rate in a large deposition area may impair the uniformity of the photoelectric conversion layer 2, the deposition rate is more preferably equal to or less than 4 μm/min (the sixth condition). In view of practicability and film quality, it is preferable that the deposition rate be 0.02 [μm/min] or more and 4 [μm/min] or less (the seventh condition). In view of better practicability, it is preferable that the deposition rate be 1 [μm/min] or more and 4 [μm/min] or less (the eighth condition). The area over the area enclosed by the bold lines in FIG. 4, in which the oxygen partial pressure is too high, is not preferable because a heterogeneous substance or CuO tends to increase in the photoelectric conversion layer 2. The area under the area enclosed by the bold lines in FIG. 4, in which the oxygen partial pressure is too low, is also not preferable because a heterogeneous substance or Cu tends to increase in the photoelectric conversion layer 2. Adjusting the deposition rate and the oxygen partial pressure contributes to the deposition of higher quality cuprous oxide.

At a low oxygen partial pressure, the sputtering takes place at a low oxygen content. Under this condition, copper will not sufficiently be oxidized and the unoxidized copper will be deposited as a Cu phase (in a metal state). The increased amount of metal-state Cu will cause the photoelectric conversion layer 2 to reflect light like a mirror. Thus, the photoelectric conversion layer 2 should preferably have a decreased amount of metal-state Cu. For example, the photoelectric conversion layer 2 formed within the area inside the bold lines and outside the thin lines and at a low oxygen partial pressure has metallic shine. The photoelectric conversion layer 2 formed within the area inside the bold lines and outside the thin lines and at a high oxygen partial pressure has a small amount of CuO and has slight cloudiness, which is visible. The photoelectric conversion layer 2 having slight cloudiness or metallic shine is still usable for a stand-alone solar cell. Such a photoelectric conversion layer 2, however, does not have high transparency required by a multi-junction solar cell. If a solar cell including a photoelectric conversion layer with opacity and/or metallic shine is used for the top cell of a multi-junction solar cell, the power generation in the bottom cell will have substantial adverse effects.

The photoelectric conversion layer 2 formed within the area inside the thin lines has no metallic shine and is transparent. Thus, this photoelectric conversion layer 2 achieves both high crystallinity and high transparency. The photoelectric conversion layer 2 with decreased crystallinity will have a gap level at a distance of 1.8 eV from the valence band maximum (VBM), for example, in the $Cu_2O$ film of the photoelectric conversion layer 2. Specifically, the $Cu_2O$ film formed at an oxygen partial pressure of approximately 2.4×d [Pa] contains a heterogeneous substance of CuO and will have a gap level. This may decrease the conversion efficiency as well as the transparency. The $Cu_2O$ film formed within the area inside the thin lines has high crystallinity and will have a very low gap level that has substantially no effect on the characteristics. Thus, this $Cu_2O$ film contributes to the high crystallinity and high conversion efficiency. If the photoelectric conversion layer 2 having a gap level is used for a solar cell as the top cell of a multi-junction solar cell that has a solar cell including a light absorbing layer of Si as the bottom cell, the top cell will absorb most of the light at a wavelength to be absorbed by the bottom cell at the bottom. Thus, also in view of the multi-junction use, the photoelectric conversion layer 2 should preferably have high crystallinity. In addition, since the photoelectric conversion layer 2 having an increased amount of Cu and reflecting light is also not preferable in view of the multi-junction use, the oxygen partial pressure should preferably be within the area inside the thin lines.

In view of the deposition of cuprous oxide with higher-quality, the oxygen partial pressure of the third condition should more preferably be 0.55×d [Pa] or more and 1.00×d [Pa] or less. The more preferable range of the oxygen partial pressure is within the area shown by the broken lines in FIG. 4. The $Cu_2O$ film formed within the area inside the broken lines has higher crystallinity. The length of the $Cu_2O$ crystals in the direction of the film thickness is almost equal to the film thickness. Such a $Cu_2O$ film is substantially homogeneous. The photoelectric conversion layer 2 formed at an oxygen partial pressure of 0.50×d [Pa] or more has substantially no metal-state Cu. Thus, increasing the oxygen partial pressure to 0.50×d [Pa] or more has only limited effects on the decrease in the content of metal-state Cu. In the photoelectric conversion layer 2 formed at an oxygen partial pressure of 0.55×d [Pa] or more, the content of metal-state Cu is almost zero. The photoelectric conversion layer 2 formed at an oxygen partial pressure of 1.50×d [Pa] or less has substantially no CuO. Thus, decreasing the oxygen partial pressure to 1.50×d [Pa] or less has only limited effects on the decrease in the content of CuO. In this view, the oxygen partial pressure should more preferably be 0.55×d [Pa] or more and 1.40×d [Pa] or less. In the photoelectric conversion layer 2 formed at an oxygen partial pressure of 1.00×d [Pa] or less, the content of metal-state Cu is almost zero. When the $Cu_2O$ film is formed at an oxygen partial pressure within the area inside the broken lines, the photoelectric conversion layer 2 will be a clear reddish-brown gem-like layer that has no metallic shine and high transparency, which is absorbed by the $Cu_2O$.

When the film thickness of $Cu_2O$ is T, the average diameter of the $Cu_2O$ crystals in the direction of the film thickness (except minute $Cu_2O$ crystals having a diameter of 50 nm or less in the direction of the film thickness) should preferably be 0.7 T or more and 1.0 T or less in the photoelectric conversion layer 2. The photoelectric conversion layer 2 containing such minute $Cu_2O$ crystals has many grain boundaries, which can probably decrease the conversion efficiency. The cross-section occupied by the minute $Cu_2O$ crystals having a diameter of 50 nm or less in the direction of the film thickness should preferably account for 10% or less of the cross-section of the photoelectric conversion layer 2.

When the photoelectric conversion layer 2 is a thin film having a film thickness of 100 nm or less, the CuO phase and the metal-state CU will have small effects on the decrease in the transparency. When the photoelectric conversion layer 2 is a thick film having a film thickness of 500 nm or more, the CuO phase and the metal-state Cu will have large effects on the decrease in the transparency. Thus, the oxygen partial pressure in sputtering should more preferably be 0.55×d [Pa] or more and 1.40×d [Pa] or less. For forming a thick photoelectric conversion layer 2 having a film thickness of 500 nm or more, the oxygen partial pressure in sputtering should more preferably be 0.55×d [Pa] or more and 1.00×d [Pa] or less.

As for sputtering conditions, the sputtering temperature (the temperature of a base substrate) is preferably 300° C. or more and 600° C. or less (the ninth condition), and the oxygen partial pressure is preferably in the range of 0.01 [Pa] or more and 4.8 [Pa] or less (the tenth condition) and $1.5 \times 10^{+9} \times e^{(-30000/sputtering\ temperature\ [K])}$ or more (the eleventh condition) (Here, e represents the Napierian number and an abbreviation of "exponential"). When all the ninth to eleventh conditions are met, the generation of heterogeneous substances such as CuO and Cu is further reduced. The temperature in the eleventh condition is not a Celsius degree but an absolute temperature in Kelvin. The range meeting these three conditions generally meets the conditions suitable for forming a CuO film. When the deposition rate is too low, a formed film may contain a large amount of CuO, which should carefully be avoided. It is preferable that the film formation be completed within approximately one hour. In the case of sputtering on a large area, in view of crystallization, the temperature in the ninth condition is preferably 300° C. or more and 550° C. or less, more preferably 350° C. or more and 550° C. or less, and more preferably 300° C. or more and 500° C. or less, and much more preferably 300° C. or more and 450° C. or less. It is preferable that the sputtering temperature be lower than the melting point of the substrate 10.

Although the $Cu_2O$ film can be formed at a sputtering temperature of approximately 200° C. or less, the grain size of the $Cu_2O$ crystals becomes small in this case, which is disadvantageous in terms of conversion efficiency. In a homogeneous $Cu_2O$ thin film having a thickness of 500 nm and a $Cu_2O$ crystal grain size of 100 nm or less, for example, small $Cu_2O$ crystals exist on top of each other in the film thickness direction and thus many grain boundaries exist in the thickness direction of the $Cu_2O$ film. When the photoelectric conversion layer 2 has grain boundaries in the flow direction of electrons, recombination will easily occur and thus electric current and voltage will decrease, which will reduce the conversion efficiency. Sputtering is basically used for film formation at a low temperature (approximately 200° C. or less). Sputtering is intended to provide a high-quality film through film formation using plasma while reducing heat damage due to a high temperature. In sputtering without intentional heating, the $Cu_2O$ crystals do not grow to the grain size approximately equal to the film thickness in the case of a $Cu_2O$ film having a thickness of hundreds nm or more. In the embodiment, however, the $Cu_2O$ crystals grow to the grain size approximately equal to the film thickness by sputtering while increasing the substrate temperature. When no grain boundary exists in the film thickness direction, the light transparency will improve. As a result, the $Cu_2O$ crystallinity improves and the conversion efficiency improves. The improved light transparency also increases the power generation in the lower solar cell, which eventually increases the total amount of electricity generated by the multi-junction solar cell. Electrons travel a longer distance in a thicker film, which makes recombination less negligible. In a thin film having a thickness of 100 nm or so, however, recombination will hardly occur even with a small grain size, and the light transparency will hardly decrease. In the embodiment, the photoelectric conversion layer 2 is 500 nm at the thinnest. In the case of a film thickness of 1 µm or more, the grain size should be enlarged in order to achieve both high conversion efficiency and high light transparency.

In addition, when the photoelectric conversion layer 2 is formed on a metallic oxide film mainly composed of Sn, Sn disperses into the $Cu_2O$ film during the film formation of the $Cu_2O$ film. This makes it easier to enlarge the grain size than in the case of sputtering on a glass substrate at the same temperature, and improves the crystallinity. By sputtering $Cu_2O$ on the metallic oxide film mainly composed of Sn at a higher temperature, the $Cu_2O$ film is formed to have $Cu_2O$ crystals with the grain size approximately equal to the film thickness, which could not be realized by sputtering at 200° C. or so. As described above, this $Cu_2O$ film is a substantially homogeneous $Cu_2O$ film and thus has excellent crystallinity in the entire film and ideal conversion efficiency for an optically transparent solar cell.

It is also possible to form a $Cu_2O$ film having $Cu_2O$ crystals with the grain size approximately equal to the film thickness by oxidizing a Cu sheet at a high temperature. In this case, however, a transparent electrode is formed on the $Cu_2O$ film after the oxidization of the Cu sheet. If a transparent electrode is formed directly on the $Cu_2O$ film by sputtering, the $Cu_2O$ crystals will be damaged, which will reduce the power generation efficiency when being applied to a solar cell. In the stacked thin film of the embodiment, in which the photoelectric conversion layer 2 is formed on the transparent electrode 1, keeps the high quality of the photoelectric conversion layer 2 after being applied to a solar cell.

Heating may be performed after sputtering. It is preferable that heating be performed on the stacked thin film 100 at a temperature equal to or more than a room temperature and equal to or less than the sputtering temperature for a predetermined period of time in the chamber.

The stacked thin film 100 manufactured in this method will pass 50% or more of light at a wavelength of 700 nm or more and 1000 nm or less, which has excellent light transparency. The stacked thin film 100 having excellent light transparency can advantageously be used for the top cell of an optically transparent solar cell or a multi-junction solar cell in which power is efficiently generated also in the bottom cell.

In this embodiment, the photoelectric conversion layer 2 is not formed on a glass member but on the first transparent electrode 1. If the photoelectric conversion layer 2 is formed on a glass member, the impurities in the glass will spread into the photoelectric conversion layer 2. This may change the film forming conditions or deteriorate the film quality of the photoelectric conversion layer 2 through the formation of impurity state. If the photoelectric conversion layer 2 is formed on a metal film usable as an electrode, the stacked thin film 100 will be opaque. Since light transparency is a necessary characteristic in this embodiment, the stacked thin film having the photoelectric conversion layer 2 on a metal film is impractical in view of light transparency. Glass partially exposed as a result of scribing is generally not a problem. This may not be applied if a cuprous oxide solar cell is used alone.

Second Embodiment

Figure 5:
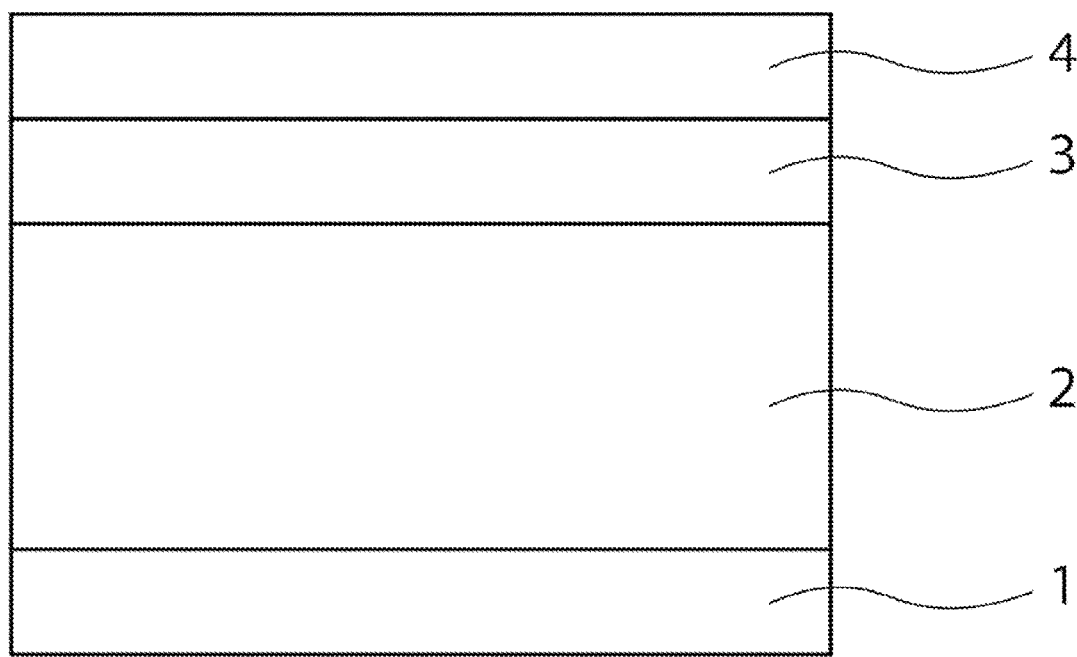
FIG. 5 is a schematic cross-sectional view of a solar cell according to an embodiment.

A second embodiment relates to a solar cell and a method for manufacturing a solar cell. FIG. 5 is a schematic cross-sectional view of a solar cell 200. The solar cell 200 of FIG. 5 includes the first transparent electrode 1, the photoelectric conversion layer 2, an n-type layer 3, and a second transparent electrode 4. The stacked body in which the first transparent electrode 1 and the photoelectric conversion layer 2 are stacked on each other is the same as the stacked thin film 100 of the first embodiment. The photoelectric conversion layer 2 is disposed between the first transparent electrode 1 and the n-type layer 3. The n-type layer 3 is disposed between the photoelectric conversion layer 2 and the second transparent electrode 4. The photoelectric conversion layer 2 and the n-type layer 3 form a pn junction. The first transparent electrode 1 and the photoelectric conversion layer 2 are the same as those of the first embodiment, and the description of these elements will be omitted. For example, an intermediate layer (not shown) may be disposed between the n-type layer 3 and the second transparent electrode 4. A solar cell having a photoelectric conversion layer with a narrower band gap than the photoelectric conversion layer 2 (e.g. a Si solar cell) can be stacked on the solar cell 200 of the second embodiment to make a multi-junction solar cell.

The n-type layer 3 is an n-type semiconductor layer disposed on the photoelectric conversion layer 2. It is preferable that the n-type layer 3 be an oxide layer or a sulfide layer. The oxide used for the n-type layer 3 is preferably selected from, but not limited to, the group including $Zn_{(1-x)}A_xO_y$ (A=Si, Ge, Sn), $Cu_{(2-x)}M_xO_Y$ (M=Mn, Mg, Ca, Zn, Sr, Ba, Al, Ga, In, Nb, Ta, lanthanoid), $Cu_2O:F$, $Cu_2O:N$, $Cu_2O:B$, $Cu_2O:Cl$, $Cu_2O:Br$, $Cu_2O:I$, and $Al_{(2-x)}Ga_xO_3$. The sulfide used for the n-type layer 3 is preferably one or more sulfides selected from, but not limited to, the group including $Zn_xIn_{(2-2x)}S_{(3-2x)}$, ZnS, and $In_xGa_{(1-x)}S$. The range of x is $0 \le x \le 1$, and the range of y is $0 \le y \le 2$.

The film thickness of the n-type layer 3 is typically 5 nm or more and 100 nm or less. If the n-type layer 3 has poor coverage, the n-type layer 3 having a thickness equal to or less than 5 nm may cause a leak current and degradation in quality. When the n-type layer 3 has good coverage, the film thickness is not limited to the above range. The n-type layer 3 having a thickness more than 100 nm may cause excessively higher resistance of the n-type layer 3 and the resulting degradation in quality, and lower transparency and the resulting current reduction due to a short circuit. Accordingly, the thickness of the n-type layer 3 is more preferably 10 nm or more and 50 nm or less. In order to obtain a film having good coverage, the surface roughness of the n-type layer 3 is preferably equal to or less than 5 nm. The high-quality n-type layer 3 enables the operation of a solar cell having a thickness of approximately 200 nm.

The conduction band offset ($\Delta E = Ecp - Ecn$), which is a difference between the level (Ecp (eV)) of the conduction band minimum (CBM) of the photoelectric conversion layer 2 and the level (Ecn (eV)) of the CBM of the n-type layer 3, is preferably −0.2 eV or more and 0.6 eV or less (−0.2 eV ≤ ΔE ≤ +0.6 eV). If the conduction band offset is more than 0, the conduction band of the pn junction interface becomes discontinuous, which causes spikes. If the conduction band offset is less than 0, the conduction band of the pn junction interface becomes discontinuous, which causes cliffs. It is preferable that the spikes and cliffs are small because both the spikes and cliffs will become barriers for photogenerated electrons. Accordingly, the conduction band offset is more preferably 0.0 eV or more and 0.4 eV or less (0.0 eV≤ΔE≤+ 0.4 eV). If the conduction takes place based on a gap level; however, this may not be applied. The level of a CBM can be estimated using the following method. The valence band maximum (VBM) is measured by photoemission spectroscopy, which is an evaluation method for an electron occupancy level, and then the band gap of an object material is estimated to determine the CBM. However, because an actual pn junction interface, in which counter diffusion occurs and lattice defects, especially cation defects exist, is not an ideal interface, the band gap may probably vary. Therefore, it is preferable that inverse photoelectron spectroscopy, which directly uses a reverse process of photoemission, be used for evaluating a CBM. Specifically, performing low-energy etching and repeated photoemission spectroscopy and inverse photoelectron spectroscopy on the surface of a solar cell can evaluate the state of electrons in a pn junction interface.

For the second transparent electrode 4, it is preferable that one of the transparent electrically-conductive oxide films listed above for the first transparent electrode 1 or the stacked body including the transparent electrically-conductive oxide film be used.

Figure 6:
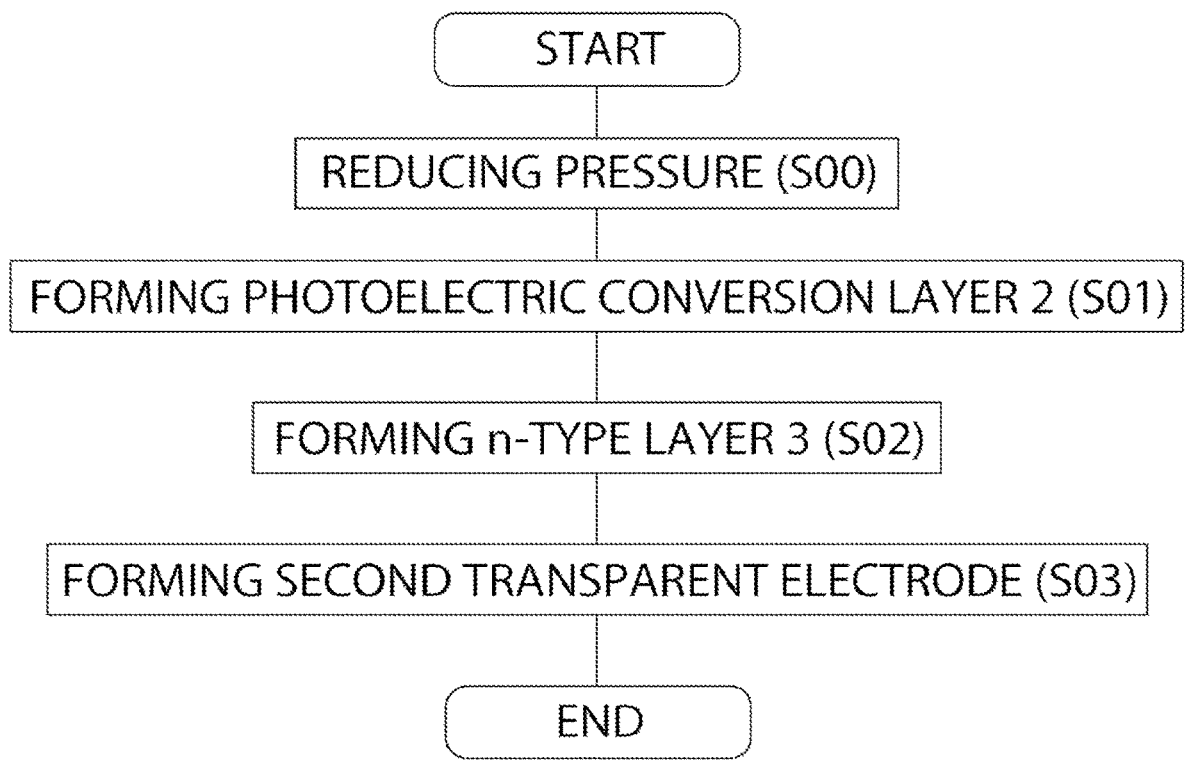
FIG. 6 is a flowchart showing a method for manufacturing a solar cell according to an embodiment.

A method for manufacturing the solar cell 200 will now be described. FIG. 6 is a flowchart showing the method for manufacturing the solar cell 200. The method for manufacturing the solar cell 200 includes: a step (S00) for reducing the pressure in the chamber where the first transparent electrode 1 is disposed to $5 \times 10^{-3}$ [Pa] or less, a step (S01) for forming the photoelectric conversion layer 2 on the first transparent electrode 1 by sputtering using a target mainly composed of copper in an atmosphere at an oxygen partial pressure of 0.01 [Pa] or more and 10 [Pa] or less, a step (S02) for forming the n-type layer 3, and a step (S03) for forming the second transparent electrode 4. The step (S00) for pressure reduction and the step (S01) for formation of the photoelectric conversion layer 2 are the same as those in the first embodiment, and the description of these steps will be omitted.

In the step (S02) for forming the n-type layer 3, the n-type layer 3 is formed on the photoelectric conversion layer 2. The n-type layer 3 can be formed by sputtering using a target of the metal included in the n-type layer 3 at a room temperature in an oxidizing atmosphere or a sulfurizing atmosphere. The method for forming the n-type layer 3 is not limited to the above method. Examples of the method include chemical bath deposition (CBD), chemical vapor deposition (CVD), atomic layer deposition (ALD), coating method, electrodeposition, spraying, and vapor deposition.

In the step (S03) for forming the second transparent electrode 4, the second transparent electrode 4 is formed on the n-type layer 3. The second transparent electrode 4 is preferably formed by sputtering, for example. When a semi-insulating film is disposed between the n-type layer 3 and the second transparent electrode 4 as an intermediate layer, for example, a ZnO film or the like is preferably formed by sputtering or the like after the formation of the n-type layer 3. The second transparent electrode 4 is then formed on the intermediate layer.

Applying the method for manufacturing the stacked thin film 100 of the first embodiment to the second embodiment enables the manufacturing of a solar cell having excellent light transparency. Using light transparent films having excellent light transparency for the photoelectric conversion layer 2 and forming light transparent films for the other layers provide a solar cell having excellent light transparency.

Third Embodiment

Figure 7:
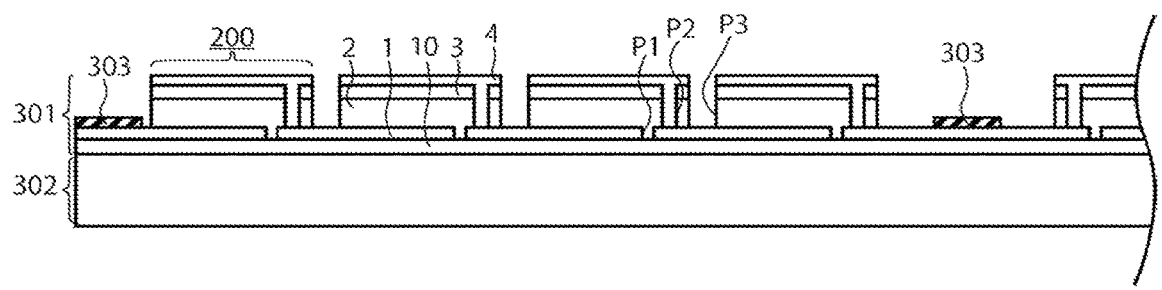
FIG. 7 is a schematic cross-sectional view of a solar cell module according to an embodiment.

The third embodiment relates to a solar cell module. FIG. 7 is a schematic cross-sectional view of a part of a solar cell module 300. The solar cell module 300 of FIG. 7 includes a top cell 301 and a bottom cell 302. The solar cell module 300 may be a unijunction solar cell module 304 including the solar cell 200 of the embodiment without the bottom cell 302 (the top cell 301 of FIG. 7), as shown in the schematic cross-sectional view of FIG. 8. The solar cell 200 of the second embodiment is used for the solar cell for the top cell 301. It is preferable that the top cell 301 and the bottom cell 302 be bonded to each other using an adhesive layer (not shown).

Figure 8:
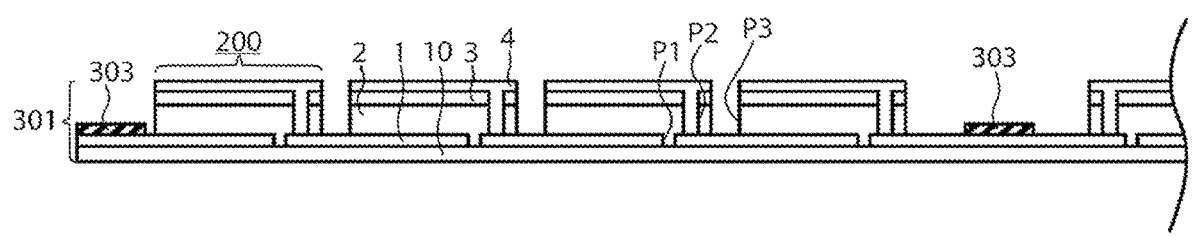
FIG. 8 is a schematic cross-sectional view of a solar cell module according to an embodiment.

The top cell 301 includes an extraction electrode 303 in electrical connection with a plurality of the solar cells 200. The solar cells 200 are electrically connected with each other. As shown in FIG. 7, the solar cells 200 connected with each other are included in a group of the top cells 301, and the solar cells 200 are electrically connected with the top cells 301. The embodiments shown in FIGS. 7 and 8 are examples in which a plurality of the solar cells 200 is modularized. As one of unshown examples, there is an embodiment in which solar cells not subjected to scribing such as the solar cell 200 of FIG. 5 are electrically connected in series or in parallel. The top cell 301 has a scribed cross-section. P1 of the first transparent electrode 1 is a first scribed cross-section. P2 of the photoelectric conversion layer 2 and the n-type layer 3 is a second scribed cross-section. P3 of the photoelectric conversion layer 2, the n-type layer 3, and the second transparent electrode 4 is a third scribed cross-section. Scribing separates the layers from each other and divides the solar cell 200 into small regions, which are electrically connected with each other. The top cell 301 has a light incident side on the second transparent electrode 4 side (the n-type layer 3 side); however, the top cell 301 may be turned over to have a light incident side on the first transparent electrode 1 side (the photoelectric conversion layer 2 side). The extraction electrode 303 is aluminum or copper wiring, for example, and connected with a terminal that extracts electricity generated by the solar cell 200.

The bottom cell 302 is a solar cell including a photoelectric conversion layer having a narrower band gap than the photoelectric conversion layer 2 of the top cell. For example, the bottom cell includes a solar cell having a Si photoelectric conversion layer. Since the top cell 301 includes the photoelectric conversion layer 2 having high transparency to light at a wavelength of 700 nm or more and 1000 nm or less, the top cell 301 combined with the bottom cell 302 that absorbs light at a wavelength in this range for power generation enables high efficient power generation of the solar cell module 300 as a whole. Electric power generated by the solar cell module 300 is transmitted through a power transmission line to be consumed or stored in a storage battery.

Figure 9:
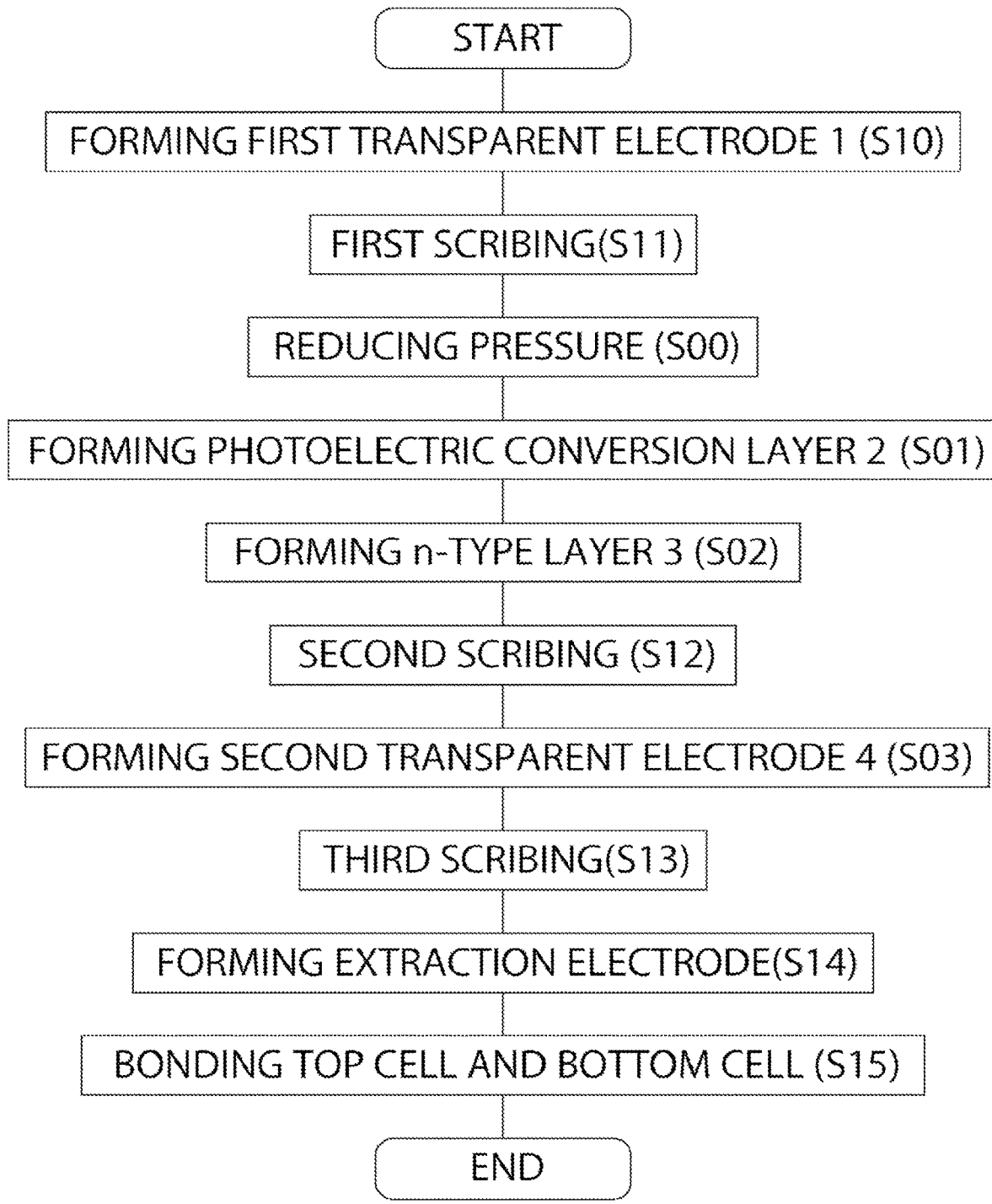
FIG. 9 is a flowchart showing a method for manufacturing a solar cell module according to an embodiment.

A method for manufacturing the solar cell module 300 will now be described. FIG. 9 is a flowchart showing the method for manufacturing the solar cell module 300. The method for manufacturing the solar cell module 300 includes: a step (S10) for forming the first transparent electrode 1 on the substrate 10, a step (S11) for scribing the first transparent electrode 1 (a first scribing), the step (S00) for reducing the pressure in the chamber where the first transparent electrode 1 is disposed to a pressure of $5 \times 10^{-3}$ [Pa] or less, the step (S01) for forming the photoelectric conversion layer 2 on the first transparent electrode 1 by sputtering using a target mainly composed of copper in an atmosphere at an oxygen partial pressure of 0.01 [Pa] or more and 10 [Pa] or less, the step (S02) for forming the n-type layer 3, a step (S12) for scribing the photoelectric conversion layer 2 and the n-type layer 3 (a second scribing), the step (S03) for forming the second transparent electrode 4, a step (S13) for scribing the photoelectric conversion layer 2, the n-type layer 3, and the second transparent electrode 4 (a third scribing), a step (S14) for forming the extraction electrode 303, and a step (S15) for bonding the top cell 301 and the bottom cell 302 that have been formed in the previous steps.

In the step (S10) for forming the first transparent electrode 1 on the substrate 10, the first transparent electrode 1 is formed on the substrate 10 by sputtering, for example. When the first transparent electrode 1 has a stacked structure, the first transparent electrode 1 is formed by repeated deposition with different targets.

In the step (S11) for scribing the first transparent electrode 1 (the first scribing), the first transparent electrode 1 is divided into several parts to expose the scribed cross-section P1. It is preferable that the cross-section P1 be exposed through laser, mechanical, or chemical processing.

The step (S00) for reducing the pressure in the chamber where the first transparent electrode 1 is disposed to $5 \times 10^{-3}$ [Pa] or less and the step (S01) for forming the photoelectric conversion layer 2 on the first transparent electrode 1 by sputtering using a target mainly composed of copper in an atmosphere at an oxygen partial pressure of 0.01 [Pa] or more and 10 [Pa] or less are the same as those in the first embodiment. In the third embodiment, the photoelectric conversion layer 2 is deposited also on the gap between two first transparent electrodes 1 (the gap between the cross-sections P1) made as a result of scribing.

The step (S02) for forming the n-type layer 3 is the same as that in the first embodiment.

In the step (S12) for scribing the photoelectric conversion layer 2 and the n-type layer 3, the photoelectric conversion layer 2 and the n-type layer 3 are cut in the stacked direction of the photoelectric conversion layer 2 and the n-type layer 3 to expose the scribed cross-section P2. It is preferable that the cross-section P2 be exposed through laser, mechanical, or chemical processing.

In the step (S03) for forming the second transparent electrode 4, the second transparent electrode 4 is formed on the n-type layer 3. When the second transparent electrode 4 has a stacked structure, the second transparent electrode 4 is formed by repeated deposition with different targets. In the third embodiment, the second transparent electrode 4 is deposited also on the gap between two photoelectric conversion layers 2 and n-type layers 3 (the gap between the cross-sections P2) made as a result of scribing.

In the step (S13) for scribing the photoelectric conversion layer 2, the n-type layer 3, and the second transparent electrode 4 (the third scribing), the photoelectric conversion layer 2, the n-type layer 3, and the second transparent electrode 4 are cut in the stacked direction of the photoelectric conversion layer 2 and the n-type layer 3 to expose the scribed cross-section P3. It is preferable that the cross-section P3 be exposed through laser, mechanical, or chemical processing. The third scribing provides a plurality of the solar cells 200 electrically connected with each other.

In the step (S14) for forming the extraction electrode 303, metal wiring is formed on the first transparent electrode 1, for example. Forming the extraction electrode 303 completes the top cell 301. After this step, it is preferable that, for example, the solar cell 200 be protected by filling gaps with resin.

The step (S15) for bonding the top cell 301 and the bottom cell 302 that have been obtained in the previous steps completes the manufacturing of the multi-junction solar cell module 300. It is preferable that the top cell 301 and the bottom cell 302 be bonded together by applying an adhesive layer between the substrate 10 and the bottom cell 302, for example.

Even if the top cell 301 has interference fringes, bonding the top cell 301 and the bottom cell 302 together substantially improves the transparency of the top cell 301, which is preferable in view of efficient power generation in the bottom cell 302.

Fifth Embodiment

Figure 10:
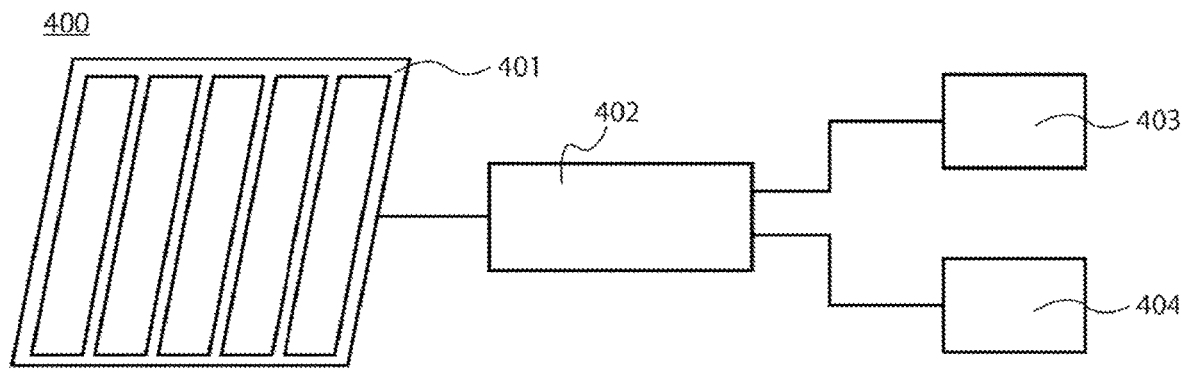
FIG. 10 is a schematic view of a solar power generation system according to an embodiment.

A fifth embodiment relates to a solar power generation system. The solar cell module of the fourth embodiment can be used as a generator for generating power in the solar power generation system of the fifth embodiment. The solar power generation system according to the present embodiment performs power generation using the solar cell module, and specifically includes a solar cell module that generates power, a unit that converts the generated electricity into power, and a storage unit for storing the generated electricity or a load for consuming the generated electricity. FIG. 10 shows the structure of a solar power generation system 400 of the present embodiment. The solar power generation system of FIG. 10 includes a solar cell module 401 (300), a converter 402, a storage battery 403, and a load 404. The storage battery 403 or the load 404 may be omitted. The load 404 may be configured to be able to use the electric energy stored in the storage battery 403. The converter 402 is a device, such as a DC to DC converter, a DC to AC converter, or an AC to AC converter, which includes a circuit or element for performing power conversion such as voltage transformation or DC to AC conversion. The configuration of the converter 402 may be any suitable configuration depending on the configuration of the generated voltage, the storage battery 403, or the load 404.

The solar battery cells included in the submodule 301, which received light, in the solar cell module 300 generates electric power, and the electric power is converted by the converter 402 to be stored in the storage battery 403 or consumed in the load 404. Preferably, the solar cell module 401 includes a sunlight tracking driving device for always directing the solar cell module 401 toward the sun or a light collector for collecting sunlight, or adds a device for further improving the power generation efficiency.

Preferably, the solar power generation system 400 is used in real estate including residences, commercial facilities or factories, or used for movable property such as an aircraft, an electronic device, and the like. By using the solar cells having excellent conversion efficiency of the present embodiment in the solar cell module, it is expected to provide the solar cell module which is lightweight and achieves an increased amount of power generation.

Figure 11:
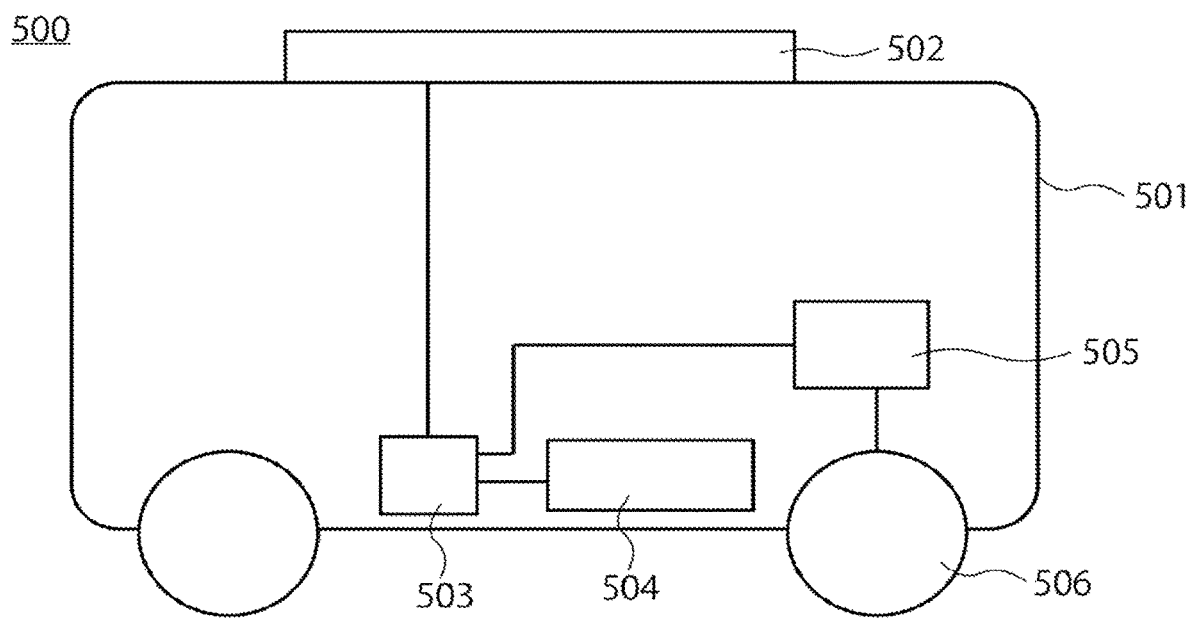
FIG. 11 is a schematic view of a vehicle according to an embodiment.

The solar power generation system 400 is applied to a vehicle, as an example. FIG. 11 is a schematic view of a vehicle 500. The vehicle 500 of FIG. 11 includes a vehicle body 501, a solar cell module 502, a power converter 503, a storage battery 504, a motor 505, and a tire (wheel) 506. Electric power generated by the solar cell module 502 provided on the top of the vehicle body 501 is converted by the power converter 503 and stored in the storage battery 504 or consumed due to the load of the motor 505 or the like. The vehicle 500 can be moved by using electric power provided from the solar cell module 502 or the storage battery 504 and operating the motor 505 to rotate the tire (wheel) 506. The solar cell module 502 may be a first solar cell module including the solar cell 200 of the second embodiment as well as a multi-junction solar cell module. The solar cell module 502 having transparency can advantageously be used on the side of the vehicle body 501 as a power-generating window as well as on the top of the vehicle body 501.

The stacked thin film 100, the solar cell 200 including the stacked thin film 100, and the solar cell module 300 including the stacked thin film 100 will now be discussed showing some examples.

EXAMPLE 1

In a chamber, an ITO transparent electrically-conductive film is deposited on a white sheet glass substrate and a Sb-doped $SnO_2$ transparent electrically-conductive film is deposited on the ITO transparent electrically-conductive film, as a backside first transparent electrode. The pressure in the chamber housing the transparent member including the first transparent electrode is reduced to $1 \times 10^{-3}$ [Pa] or less. A cuprous oxide compound film is formed as a photoelectric conversion layer by RF magnetron sputtering through heating at 500° C. in an atmosphere of oxygen and argon gas. At this time, the oxygen partial pressure is 0.035 [Pa], the deposition rate is 0.04 [μm/min], and the film thickness is 2 μm. By sputtering at a room temperature, n-type $Zn_{0.8}Ge_{0.2}O_x$ is deposited on the p-cuprous oxide layer, and then an AZO transparent electrically-conductive film is deposited as a frontside second transparent electrode. The frontside second transparent electrode is deposited at a room temperature in order to prevent the oxidation of cuprous oxide; however, using AZO provides a low-resistant film even by the deposition at a room temperature, for example. The AZO target has 2 wt % of $Al_2O_3$ with respect to ZnO. When an anti-reflective film is used to increase the amount of light to be taken, $MgF_2$, for example, is deposited on the second transparent electrode as an anti-reflective film.

EXAMPLE 2

In a chamber, an ITO transparent electrically-conductive film is deposited on a white sheet glass substrate and a Sb-doped $SnO_2$ transparent electrically-conductive film is deposited on the ITO transparent electrically-conductive film, as a backside first transparent electrode. The pressure in the chamber housing the transparent member including the first transparent electrode is reduced to $1 \times 10^{-3}$ [Pa] or less. A cuprous oxide compound film is formed as a photoelectric conversion layer by DC magnetron sputtering at 450° C. in an atmosphere of oxygen and argon gas. At this time, the oxygen partial pressure is 0.15 [Pa], the deposition rate is 0.2 [μm/min], and the film thickness of the photoelectric conversion layer is 2 μm. By sputtering at a room temperature, n-type $Zn_{0.8}Ge_{0.2}O_x$ is deposited on the p-cuprous oxide layer. An AZO transparent electrically-conductive film is then deposited as a frontside second transparent electrode. The AZO target has 2 wt % of $Al_2O_3$ with respect to ZnO. $MgF_2$ is deposited on the second transparent electrode as an anti-reflective film.

EXAMPLE 3

The solar cell is made under the same conditions as in Example 1 except that the deposition rate is 0.032 [μm/min], the oxygen partial pressure is 0.0166 [Pa], and the film thickness is 2 μm.

EXAMPLE 4

The solar cell is made under the same conditions as in Example 1 except that the deposition rate is 0.017 [μm/min], the oxygen partial pressure is 0.025 [Pa], and the film thickness is 2 μm.

EXAMPLE 5

The solar cell is made under the same conditions as in Example 1 except that the $Cu_2O$ film is formed to have a thickness of 3 μm by sputtering at 490° C.

EXAMPLE 6

The solar cell is made under the same conditions as in Example 1 except that the $Cu_2O$ film is formed to have a thickness of 500 nm by sputtering at 350° C.

EXAMPLE 7

The solar cell is made under the same conditions as in Example 1 except that the $Cu_2O$ film is formed to have a thickness of 1.5 μm by sputtering at 300° C.

COMPARATIVE EXAMPLE 1

In a chamber, an ITO transparent electrically-conductive film is deposited on a white sheet glass substrate and a Sb-doped $SnO_2$ transparent electrically-conductive film is deposited on the ITO transparent electrically-conductive film, as a backside first transparent electrode. The pressure in the chamber housing the transparent member including the first transparent electrode is reduced to $1 \times 10^{-3}$ [Pa] or less. A cuprous oxide compound film is formed as a photoelectric conversion layer by RF magnetron sputtering through heating at 500° C. in an atmosphere of oxygen and argon gas. At this time, the oxygen partial pressure is 0.009 [Pa] and the deposition rate is 0.04 [μm/min]. By sputtering at a room temperature, n-type $Zn_{0.8}Ge_{0.2}O_x$ is deposited on the p-cuprous oxide layer. An AZO transparent electrically-conductive film is then deposited as a frontside second transparent electrode. The frontside second transparent electrode is deposited at a room temperature in order to prevent the oxidation of cuprous oxide; however, using AZO provides a low-resistant film even by the deposition at a room temperature, for example. The AZO target has 2 wt % of $Al_2O_3$ with respect to ZnO. $MgF_2$ is deposited on the second transparent electrode as an anti-reflective film.

COMPARATIVE EXAMPLE 2

The solar cell is made under the same conditions as in Example 1 except that the deposition rate is 0.01 [μm/min], the oxygen partial pressure is 0.034 [Pa], and the film thickness is 580 nm.

COMPARATIVE EXAMPLE 3

The solar cell is made under the same conditions as in Example 1 except that the deposition rate is 0.01 [μm/min], the oxygen partial pressure is 0.034 [Pa], and the film thickness is 2 μm.

COMPARATIVE EXAMPLE 4

The solar cell is made under the same conditions as in Example 1 except that the deposition rate is 0.017 [μm/min], the oxygen partial pressure is 0.034 [Pa], and the film thickness is 500 nm.

COMPARATIVE EXAMPLE 5

The solar cell is made under the same conditions as in Example 1 except that the deposition rate is 0.0325 [μm/min], the oxygen partial pressure is 0.0147 [Pa], and the film thickness is 650 nm.

COMPARATIVE EXAMPLE 6

The solar cell is made under the same conditions as in Example 1 except that the deposition rate is 0.0333 [μm/min] and the oxygen partial pressure is 0.0035 [Pa].

COMPARATIVE EXAMPLE 7

The solar cell is made under the same conditions as in Example 1 except that the $Cu_2O$ film is formed by sputtering at room temperature.

COMPARATIVE EXAMPLE 8

The solar cell is made under the same conditions as in Example 1 except that the $Cu_2O$ film is formed by sputtering at 200° C.

COMPARATIVE EXAMPLE 9

The $Cu_2O$ film was formed, by sputtering at 500° C., on the ITO film without an Sb-doped $SnO_2$ transparent electrically-conductive film, which resulted in the deformation of the substrate. The film formation of the $Cu_2O$ film was then stopped.

The light transparency of the obtained solar cell was evaluated at a wavelength of 700 nm. When the light transparency was 60% or more and 100% or less, the solar cell was evaluated as level A. When the light transparency was 20% or more and less than 60%, the solar cell was evaluated as level B. When the light transparency was less than 20%, the solar cell was evaluated as level C. The conversion efficiency of the obtained solar cell was also determined. When the relative value to Comparative Example 1 was more than 1, the solar cell was evaluated as level A. When the relative value was 0.6 or more and less than 1, the solar cell was evaluated as level B. When the relative value was 0.1 or more and less than 0.6, the solar cell was evaluated as level C. When the average grain size of the $Cu_2O$ crystals in the photoelectric conversion layer (the reference area: D10 to D90) was 1000 nm or more, the solar cell was evaluated as level A. When the average grain size was 500 nm or more and less than 1000 nm, the solar cell was evaluated as level B. When the average grain size was less than 500 nm, the solar cell was evaluated as level C. When the ratio of the average grain size of the crystals to the thickness of the photoelectric conversion layer was 0.5 or more, the solar cell was evaluated as level A. The ratio was 0.25 or more and less than 0.5, the solar cell was evaluated as level B. When the ratio was less than 0.25, the solar cell was evaluated as level C. The results are shown in Table 1.

TABLE 1A

|  | Light Transparency | Conversion Efficiency |
| --- | --- | --- |
| Example 1 | A | A |
| Example 2 | A | A |
| Example 3 | B | A |
| Example 4 | B | A |
| Example 5 | A | A |
| Example 6 | B | A |
| Example 7 | B | A |
| Comparative Example 1 | C | C |
| Comparative Example 2 | B | B |
| Comparative Example 3 | C | C |
| Comparative Example 4 | B | B |
| Comparative Example 5 | B | B |
| Comparative Example 6 | C | C |
| Comparative Example 7 | C | C |
| Comparative Example 8 | C | C |
| Comparative Example 9 | — | — |

TABLE 1B

|  | Average Grain Size | Average Grain Size/Film Thickness |
| --- | --- | --- |
| Example 1 | A | A |
| Example 2 | A | A |
| Example 3 | A | A |
| Example 4 | A | A |
| Example 5 | A | A |
| Example 6 | C | A |
| Example 7 | B | B |
| Comparative Example 1 | B | B |
| Comparative Example 2 | C | B |
| Comparative Example 3 | B | B |
| Comparative Example 4 | C | B |
| Comparative Example 5 | C | B |
| Comparative Example 6 | C | C |
| Comparative Example 7 | C | C |
| Comparative Example 8 | C | C |
| Comparative Example 9 | — | — |

Both the solar cells of Examples 1 and 2 have a light transparency equal to or more than 60%, which is excellent in a light transparency. Since these solar cells have high transparency to light at a wavelength of 700 nm, they can advantageously be applied to multi-junction solar cells (modules) in which they are connected with Si solar cells in tandem junctions. The high light transparencies of the solar cells of Examples 1 and 2 demonstrate that the cuprous oxide layers in the photoelectric conversion layers have excellent crystallinity. The excellent crystallinity is reflected on the conversion efficiencies of the solar cells of Examples, both of which are better than that of Comparative Example. The solar cells of Examples 3 and 4, in which the $Cu_2O$ films contain small amounts of Cu and CuO, have lower transparencies than those of Examples 1 and 2, while their conversion efficiencies are good. For the use in a tandem solar cell including a Si solar cell as the bottom cell, for example, a solar cell having high transparency such as those of Examples 1 and 2 is preferable because light at a relatively long wavelength should reach the bottom cell of the tandem solar cell. The oxygen partial pressures of Examples 1 and 2 are in the range of 0.5×d [Pa] or more and 1.5×d [Pa] or less. Even if the oxygen partial pressures are outside the range of 0.5×d [Pa] or more and 1.5×d [Pa] or less, a solar cell having an oxygen partial pressure of 0.24×d [Pa] or more and 2.4×d [Pa] or less, or 0.01 [Pa] or more and 4.8 [Pa] or less will have light transparency and conversion efficiency although such a solar cell is inferior to the solar cells of Examples 1, 2, 3, and 4, for example. Even if the deposition rate is in the preferable range, too high oxygen partial pressure tends to cause CuO generation and too low oxygen partial pressure tends to cause Cu generation. Therefore, it is important to form a cuprous oxide layer within the above range.

In the description, some elements are described only by their element symbols.

From the comparisons between Examples 5 to 7, it is found that the grain size of the crystals is smaller at a lower temperature. Therefore, it is difficult to enlarge the $Cu_2O$ grain size in film formation at a low temperature. When the $Cu_2O$ film thickness is small as in Example 6, the solar cell has relatively good characteristics regardless of the small grain size of the crystals. This application is possible because the thin film enhances the transparency and thus enables the efficient power generation in the bottom cell.

In Comparative Example 9, the film formation was attempted not on the $SnO_2$ film but on the ITO film; however, increasing the substrate temperature softened the substrate with the ITO film and the Cu2O film formation got unstable. The film formation was then stopped. Therefore, the light transparency, the conversion efficiency, and the grain size were not evaluated as to Comparative Example 9.

Figure 12:
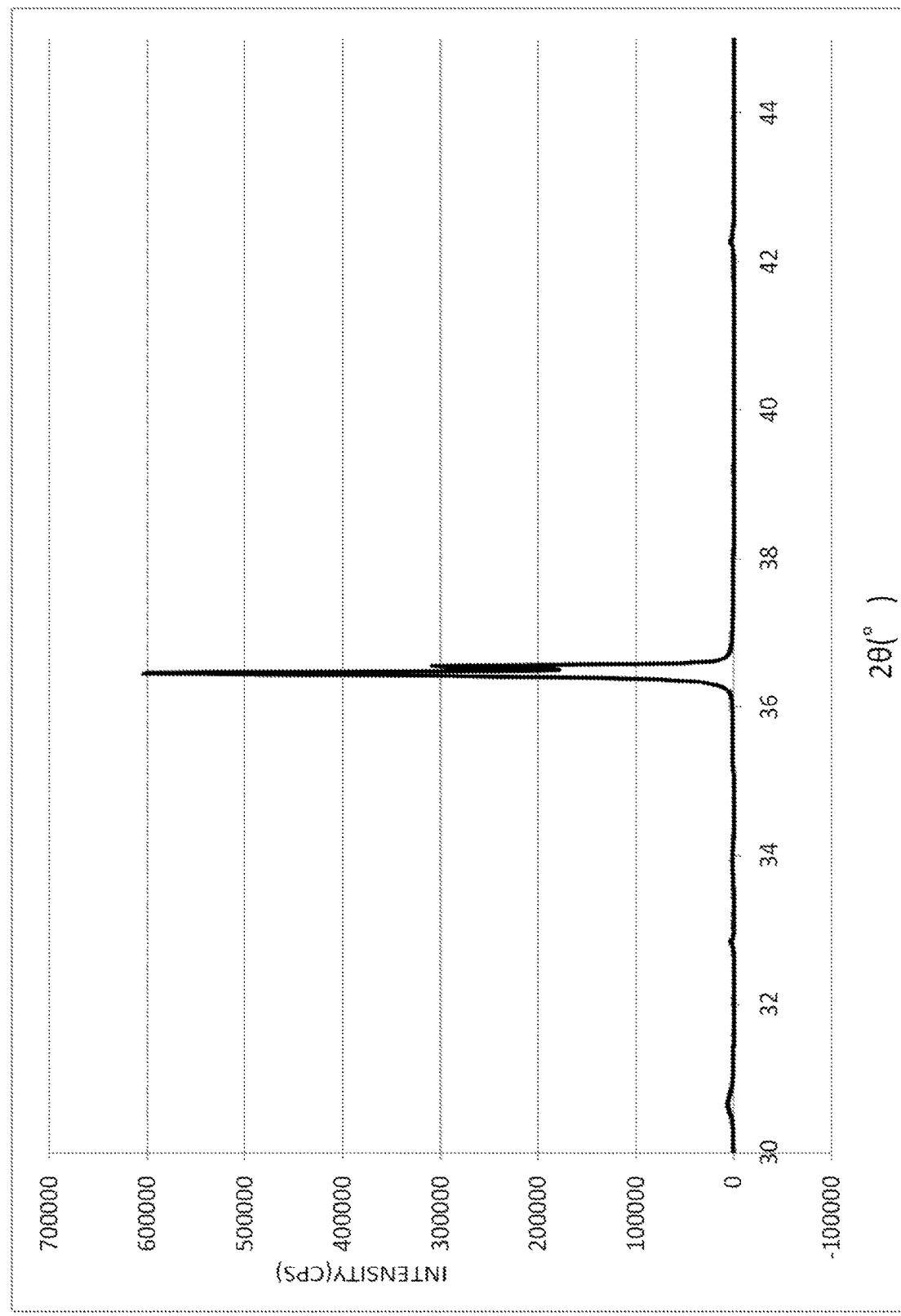
FIG. 12 is a graph showing measurement results of Example 5 obtained through X-ray diffraction (XRD).

FIG. 12 is a graph showing measurement results obtained through X-ray diffraction (XRD) on the stacked thin film including the photoelectric conversion layer and the transparent electrode of Example 5. As shown in the results of XRD, no heterogeneous substances such as CuO are determined, which means the stacked thin film is a substantially homogeneous $Cu_2O$ film. In addition, since the half value width of the $Cu_2O$ (111) peak between 36° to 37° is very narrow, the high crystallinity of the photoelectric conversion layer of the embodiment is confirmed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a stacked thin film, comprising:
    forming a photoelectric conversion layer on a first transparent electrode by sputtering using a target mainly composed of copper in an atmosphere at an oxygen partial pressure in a range of 0.01 [Pa] or more and 4.8 [Pa] or less, wherein
    the oxygen partial pressure of the sputtering is in the above range, and 0.5×d [Pa] or more and 1.5×d [Pa] or less when a deposition rate is d [μm/min], in formation of the photoelectric conversion layer, and
    a sputtering temperature is 300° C. or more and 600° C. or less, in formation of the photoelectric conversion layer.

2. The manufacturing method according to claim 1, wherein the sputtering temperature is 350° C. or more and 550° C. or less, in formation of the photoelectric conversion layer.

3. The manufacturing method according to claim 1, wherein the oxygen partial pressure is $1.5 \times 10^{+9} \times e^{(-30000/sputtering\ temperature\ [K])}$ or more, in formation of the photoelectric conversion layer.

4. The manufacturing method according to claim 1, wherein the deposition rate is 0.02 [μm/min] or more and 4 [μm/min] or less, in formation of the photoelectric conversion layer.

5. The manufacturing method according to claim 1, wherein the oxygen partial pressure is 0.55×d [Pa] or more and 1.4×d [Pa] or less when a deposition rate is d [μm/min], in formation of the photoelectric conversion layer.

6. The manufacturing method according to claim 1, wherein the photoelectric conversion layer is a p-type compound semiconductor layer mainly composed of cuprous oxide.

7. A method for manufacturing a solar cell, wherein a stacked thin film is manufactured by the manufacturing method according to claim 1.

8. A method for manufacturing a solar cell module, wherein a stacked thin film is manufactured by the manufacturing method according to claim 1.

* * * * *